(12) United States Patent
Basker et al.

(10) Patent No.: US 9,466,602 B1
(45) Date of Patent: Oct. 11, 2016

(54) EMBEDDED DYNAMIC RANDOM ACCESS MEMORY FIELD EFFECT TRANSISTOR DEVICE

(71) Applicant: International Business Machines Corporation, Armonk, NY (US)

(72) Inventors: Veeraraghavan S. Basker, Schenectady, NY (US); Shogo Mochizuki, Clifton Park, NY (US); Alexander Reznicek, Troy, NY (US); Dominic J. Schepis, Wappinger Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/084,892

(22) Filed: Mar. 30, 2016

Related U.S. Application Data

(63) Continuation-in-part of application No. 14/739,004, filed on Jun. 15, 2015.

(51) Int. Cl.
| | | |
|---|---|---|
| *H01L 27/108* | (2006.01) | |
| *H01L 27/088* | (2006.01) | |
| *H01L 21/84* | (2006.01) | |
| *H01L 21/82* | (2006.01) | |
| *H01L 29/66* | (2006.01) | |
| *H01L 29/78* | (2006.01) | |
| *H01L 21/8238* | (2006.01) | |

(52) U.S. Cl.
CPC . *H01L 27/10879* (2013.01); *H01L 21/823821* (2013.01); *H01L 21/845* (2013.01); *H01L 27/0886* (2013.01); *H01L 27/1087* (2013.01); *H01L 27/10826* (2013.01); *H01L 29/66795* (2013.01); *H01L 29/7831* (2013.01)

(58) Field of Classification Search
CPC .......... H01L 27/10826; H01L 21/845; H01L 29/7831; H01L 27/10879
See application file for complete search history.

(56) References Cited

U.S. PATENT DOCUMENTS

| 9,224,740 B1 | 12/2015 | Polvino et al. |
| 2014/0183626 A1 | 7/2014 | Juengling |
| 2015/0279839 A1* | 10/2015 | Basker ............... H01L 27/0883 257/392 |

* cited by examiner

*Primary Examiner* — Thanhha Pham
(74) *Attorney, Agent, or Firm* — Cantor Colburn LLPX; Steven Meyers

(57) ABSTRACT

A method comprises forming a cavity in a substrate, depositing a silicon material in the cavity, forming a fin in the substrate and the silicon material such that a first portion of the fin is formed from the substrate and a second portion of the fin is formed from the deposited silicon material, forming a gate stack over the fin, growing an oxide material over the first portion of the fin and the second portion of the fin, removing the oxide material from the first portion of the fin, growing an epitaxial material on an exposed portion of the first portion of the fin, removing the oxide material from the second portion of the fin, and growing an epitaxial material on exposed portions of the second portion of the fin.

1 Claim, 5 Drawing Sheets

EMBEDDED DYNAMIC RANDOM ACCESS MEMORY FIELD EFFECT TRANSISTOR DEVICE

PRIORITY

This application is a continuation of and claims priority from U.S. patent application Ser. No. 14/739,004, filed on Jun. 15, 2015, entitled "EMBEDDED DYNAMIC RANDOM ACCESS MEMORY FIELD EFFECT TRANSISTOR DEVICE," the entire contents of which are incorporated herein by reference.

BACKGROUND

The present invention relates to embedded dynamic random access memory (eDRAM) field effect transistors (FETs), and more specifically, to FINFETs used for eDRAM.

FINFET devices often include a plurality of semiconductor fins arranged on a substrate. Gate stacks are arranged on the fins to form FET devices. During fabrication, the dimensions of the fins may be increased by using an epitaxial growth process that grows epitaxial silicon on exposed regions of the fins.

SUMMARY

According to one embodiment of the present invention, a method comprises forming a cavity in a substrate, depositing a silicon material in the cavity, forming a fin in the substrate and the silicon material such that a first portion of the fin is formed from the substrate and a second portion of the fin is formed from the deposited silicon material, forming a gate stack over the fin, growing an oxide material over the first portion of the fin and the second portion of the fin, removing the oxide material from the first portion of the fin, growing an epitaxial material on an exposed portion of the first portion of the fin, removing the oxide material from the second portion of the fin, and growing an epitaxial material on exposed portions of the second portion of the fin.

According to another embodiment of the present invention, a method comprises forming a fin on a substrate, the fin having a first portion comprising a first material and a second portion comprising a second material, growing a layer of oxide material on the first portion and the second portion of the fin, wherein the layer of oxide material on the first portion of the fin has a thickness greater than a thickness of the of the layer of oxide material on the second portion of the fin, removing the layer of oxide material from the first portion of the fin to expose the first portion of the fin, growing an epitaxial material on the exposed first portions of the fin, removing the layer of oxide material from the second portion of the fin to expose the second portion of the fin, and growing an epitaxial material on the exposed second portions of the fin.

According to yet another embodiment of the present invention, a method comprises forming a cavity in a crystalline silicon substrate, depositing a first layer of polysilicon material in the cavity, depositing an oxide material in the cavity on the first layer of polysilicon material, depositing a second layer of polysilicon material over the first layer of polysilicon material and the oxide material, removing a portion of the fin and the first layer of polysilicon material to expose the oxide material in the cavity, forming a gate stack in the cavity, forming a layer of oxide material over exposed portions of the fin, wherein the layer of oxide material formed over the polysilicon portion has a greater thickness than the layer of oxide material formed over the crystalline silicon portion, removing the layer of oxide material formed over the crystalline silicon portion, growing an epitaxial silicon material on exposed portions of the crystalline silicon portion removing the layer of oxide material formed over the polysilicon portion, and growing an epitaxial silicon material on exposed portions of the polysilicon portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In FINFET devices, such as, for example embedded dynamic random access memory (eDRAM) devices, a fin is formed on the substrate by patterning the substrate to remove portions of the substrate material. If a deep trench region is formed in the substrate, the deep trench region may be subsequently filled with, for example, polysilicon and patterned to form a portion of the fin. In such an arrangement, one portion of the fin is formed from the crystalline silicon of the substrate, and another portion of the fin is formed from polysilicon. Following the formation of the fin, when an epitaxial growth is performed, the epitaxial silicon grows at different rates on the exposed polysilicon and the exposed crystalline silicon. The different growth rates may result in an undesirable connection between portions of the fins, which may cause an electrical short across devices.

The methods and resulting devices described below manage the differing epitaxial growth rates to avoid undesirable connections between devices.

Figure 1A:
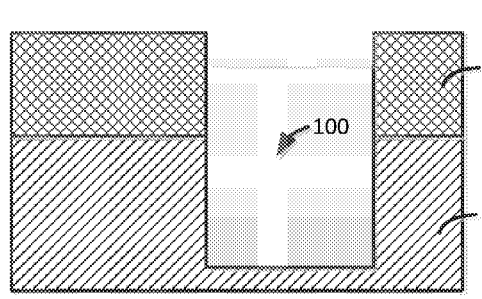
FIG. 1A illustrates a cut away view along line A of FIG. 1B of a substrate and hardmask.
Figure 1B:
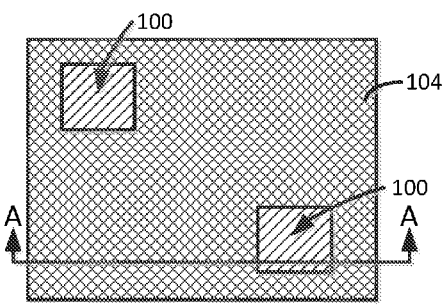
FIG. 1B illustrates a top view of FIG. 1A.

FIG. 1A and FIG. 1B are cross-sectional and top views, respectively, that illustrates a substrate 102 that may include, for example, crystalline silicon. A hardmask 104 a nitride material is patterned on the substrate 102. A trench 100 has been patterned in the substrate 102 using a suitable etching process such as, for example, reactive ion etching (ME).

Figure 2A:
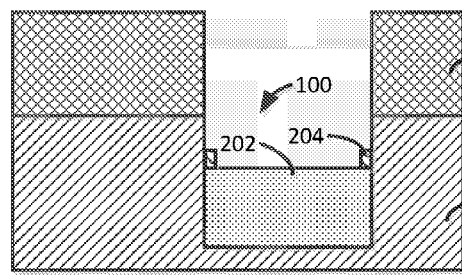
FIG. 2A illustrates the formation of a first fill material.
Figure 2B:
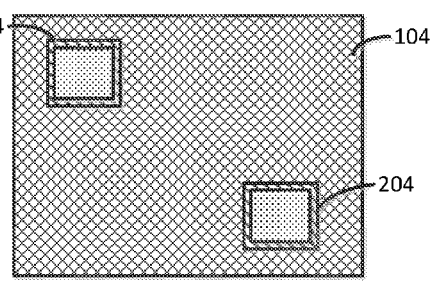
FIG. 2B illustrates a top view of FIG. 2A.

FIG. 2A illustrates the formation of a first fill material 202 that is formed in the trench 100. The first fill material 202 may include, for example, a polysilicon material deposited by, for example, a furnace deposition process. An oxide material 204 has been formed in the trench 100 on a peripheral region of the first fill material 202. The oxide layer is formed by, for example, depositing a conformal oxide film using an atomic layer deposition (ALD) process and using an RIE process to form the structure; the film minimizes epitaxial growth from the exposed bottom portions of the capacitor structure. FIG. 2B illustrates a top view of FIG. 2A.

Figure 3:
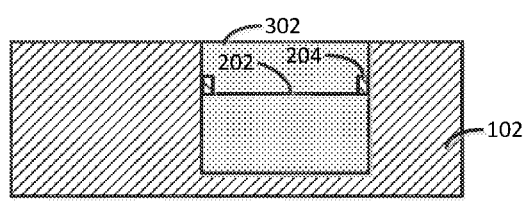
FIG. 3 illustrates the formation of a second fill material.

FIG. 3 illustrates the formation of a second fill material 302 in the trench 100 (of FIG. 2). The second fill material 302, may include, for example, a polysilicon material that fills the trench 100 and covers the first fill material 202 and the oxide material 204.

Figure 4A:
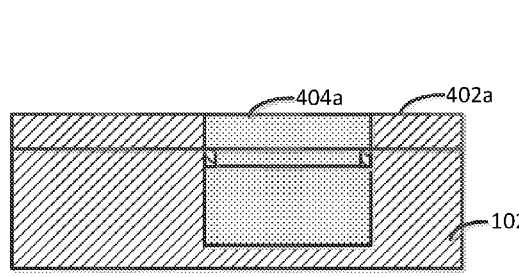
FIGS. 4A and 4B illustrate a cut away view and a top view respectively of the patterning of fins.
Figure 4B:
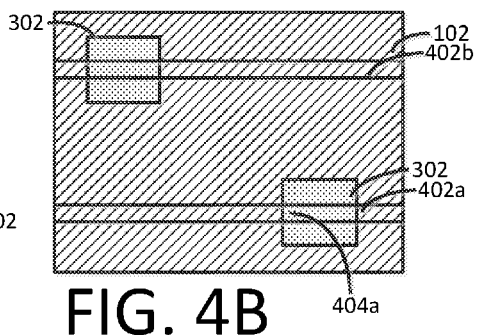

FIGS. 4A and 4B illustrate a cut away view and a top view, respectively, of the resultant structure following the patterning of fins 402a and 402b. The fins 402 are formed using, for example, a lithographic patterning and etching process such as RIE. In the illustrated embodiment, the fin 402a is formed by removing exposed portions of the substrate 102 and the second fill material 302. The fin 402a includes a second fill material portion 404a that is formed from the second fill material 302. In the illustrated embodiment, the substrate 102 includes crystalline silicon, and the second fill material 302 includes polysilicon, however other materials may be used.

Figure 5A:
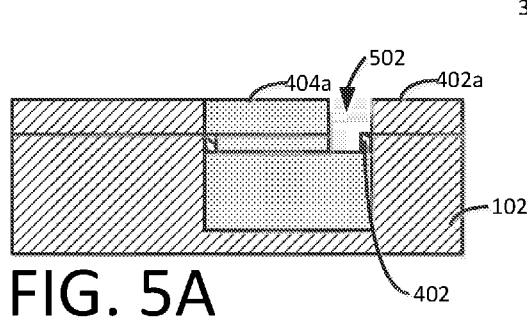
FIGS. 5A and 5B illustrate a cut away view and a top view respectively following the formation of a cavity.
Figure 5B:
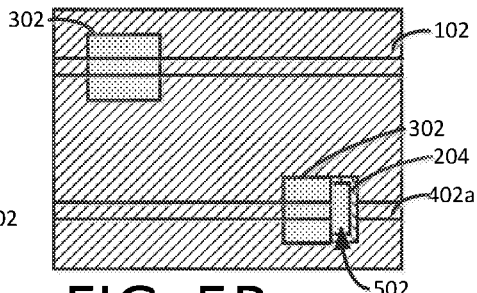

FIGS. 5A and 5B illustrate a cut away view and a top view, respectively, following the formation of a cavity 502 that removes a portion of the fin 402a and the second fill material 302 to expose a portion of the oxide material 204. The cavity is used to form a deep trench isolation region in the substrate 102.

Figure 6A:
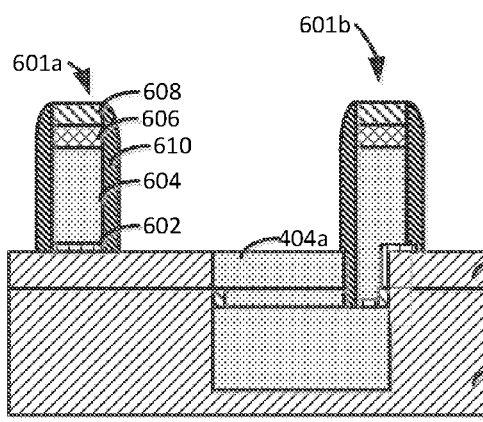
FIG. 6A illustrates a cut away view along the line B of FIG. 6B of the formation of gate stacks.
Figure 6B:
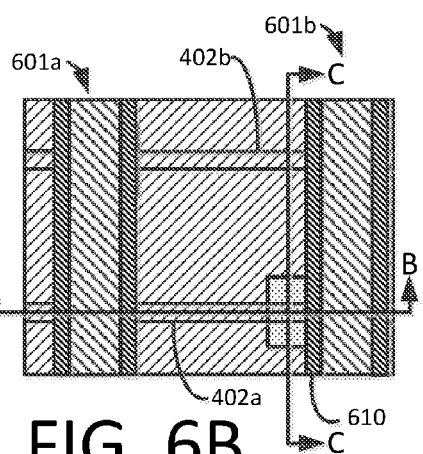
FIG. 6B illustrates a top view.
Figure 6C:
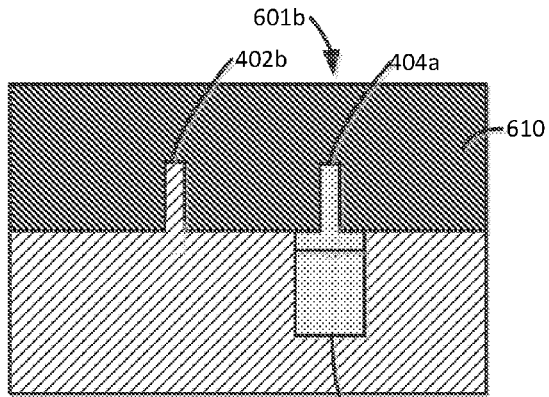
FIG. 6C illustrates a cut away view along the line C of FIG. 6B.

FIG. 6A illustrates a cut away view along the line B (of FIG. 6B), FIG. 6B illustrates a top view, and FIG. 6C illustrates a cut away view along the line C (of FIG. 6B) of the resultant structure following the formation of gate stacks 601a and 601b. The gate stacks 601a and 601b include, for example, a metal layer 602, a polysilicon layer 604 arranged on the metal layer 602, a hardmask layer 606 arranged on the polysilicon layer, an insulator layer 608 arranged on the hardmask layer 606, and spacers 610 arranged adjacent to the gate stacks 601. The gate stacks 601 may be formed using any suitable deposition and patterning process and materials.

Figure 7:
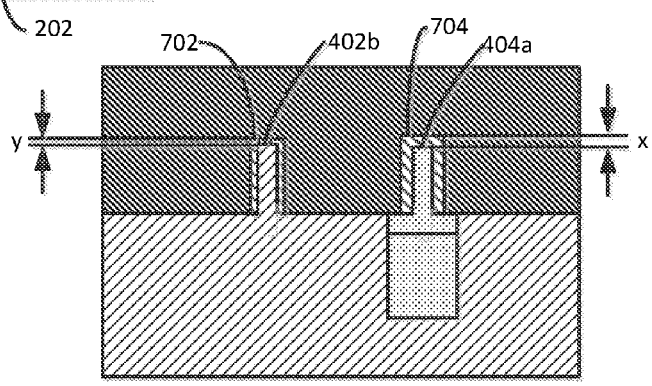
FIG. 7 illustrates a cut away view of the formation of an oxide material on the fins.

FIG. 7 illustrates a cut away view of the resultant structure following the formation of an oxide material on exposed portions of the fins 402. The fin 402a includes the second fill material portion 404a and a portion formed from the substrate 102. The oxide material is grown on the exposed portions of the fins 402 using a process such as, for example, thermal oxidation. Referring to FIG. 7, the cut away portion of fin 402a (of FIG. 6A) has a portion 404a that is formed from, for example, polysilicon and the cut away portion of the fin 402b is formed from crystalline silicon. In this example, polysilicon has a faster oxidation rate than crystalline silicon. Thus, the oxide layer 704 formed on the second fill material portion 404a of the fin 402a has a thickness x that is greater than the thickness y of the oxide layer 702 that is formed on the crystalline silicon portion of the fin 402b.

Figure 8:
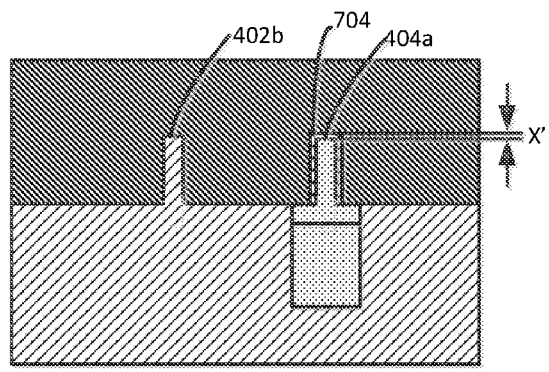
FIG. 8 illustrates the removal of the oxide layer.

FIG. 8 illustrates the resultant structure following the removal of the oxide layer 702 (of FIG. 7), which exposes the crystalline silicon portion of the fin 402b and reduces the thickness of the oxide layer 704 to a thickness x'. In the illustrated example, a SiCoNi epitaxy pre-clean process is used to remove exposed oxide material. However, other suitable processes that remove oxide material may be used in other embodiments. Once the oxide layer 702 is removed, the oxide removal process is stopped leaving a portion of the oxide layer 704 that obscures the second fill material portion 404a of the fin 402a. In the illustrated embodiment, the SiCoNi epitaxy pre-clean process is a remote plasma assisted dry etch process that simultaneously exposes the substrate to H2, NF3 and NH3 plasma by-products. The etch is conformal and is selective to silicon oxide while not substantially etching silicon. Solid by-products are removed following the etch via sublimination as the temperature of the substrate is increased. The SiCoNi epitaxy pre-clean process selectively removes silicon oxide from silicon with a high degree of control of the depth of the etch.

Figure 9:
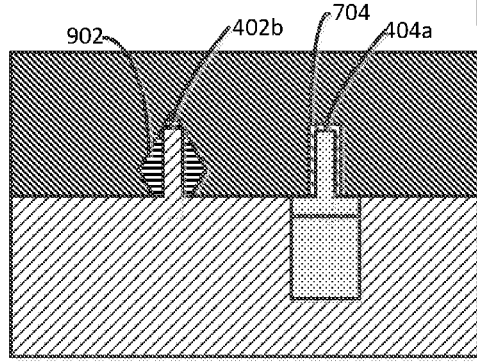
FIG. 9 illustrates the resultant structure following an epitaxial growth process.

FIG. 9 illustrates the resultant structure following an epitaxial growth process that grows an epitaxial silicon material 902 on exposed portions of the fins 402. In this regard, the second fill material portion 404a of the fin 402 is protected or obscured by the oxide layer 704 while the epitaxial silicon material 902 is grown on the exposed crystalline silicon portions of the fin 402b.

Figure 10:
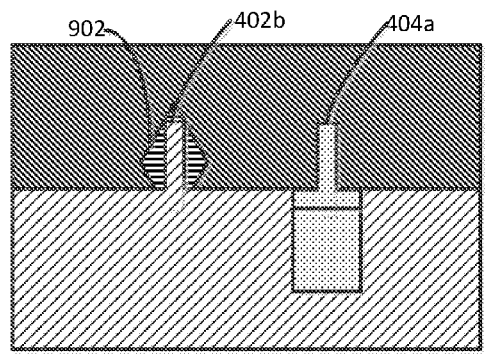
FIG. 10 illustrates the resultant structure after the oxide layer is removed.

FIG. 10 illustrates the resultant structure after the oxide layer 704 is removed from the second fill material portion 404a of the fins 402. The oxide layer 704 may be removed using a similar cleaning process as described above or another suitable process that removes the oxide layer 704 to expose the second fill material portion 404a of the fins 402.

Figure 11A:
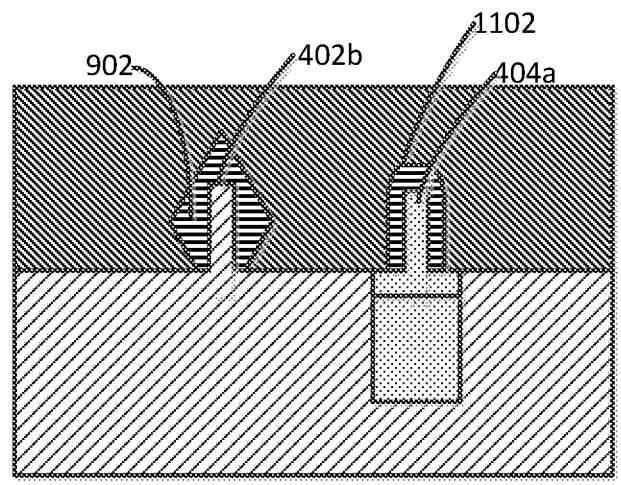
FIG. 11A illustrates a cut away view along the line D of FIG. 11B showing an epitaxial growth process.
Figure 11B:
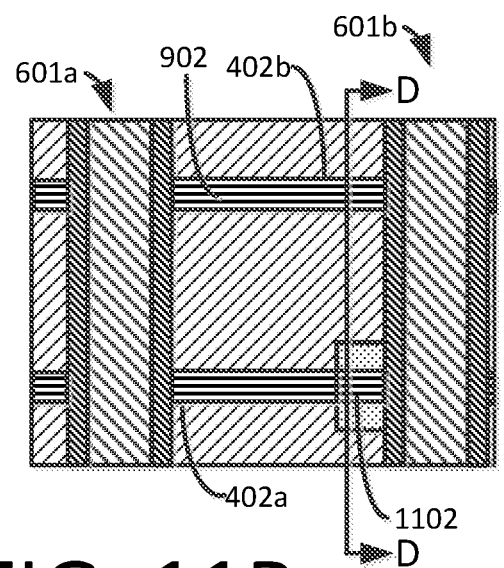
FIG. 11B shows a top view of FIG. 11A.

FIG. 11A illustrates a cut away view along the line D (of FIG. 11B) showing the resultant structure following an epitaxial growth process that grows epitaxial silicon 1102 on the exposed portions of the second fill material portion 404a of the fin 402a. The epitaxial growth process grows additional epitaxial silicon on the fin 402b thereby increasing the volume of the epitaxial silicon material 902.

Though the exemplary embodiments described above include fins formed from polysilicon and crystalline silicon materials, this method may be used with features formed from other materials having dissimilar oxide growth rates and dissimilar epitaxial growth rates.

The exemplary embodiments described above provide a method and resulting structure with a managed epitaxial silicon growth on fins formed from dissimilar materials to prevent the shorting of devices arranged on the substrate.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method comprising:
   forming a cavity in a semiconductor substrate;
   depositing a first layer of semiconductor material in the cavity;
   depositing a layer of oxide material on the over the semiconductor substrate and over the first layer of semiconductor material in the cavity;
   performing an anisotropic etching process to remove portions of the layer of oxide material from the semiconductor substrate and from portions of the first layer of semiconductor material to expose a portion of the first layer of semiconductor material in the cavity;
   depositing a second layer of semiconductor material over exposed portions of the layer of oxide material and the first layer of semiconductor material in the cavity;
   forming a first fin from the second layer of semiconductor material and the semiconductor substrate by removing portions of the semiconductor substrate and portions of the second layer of semiconductor material;
   removing a portion of the second layer of semiconductor material of the first fin to expose a portion of the first layer of semiconductor material and a portion of the layer of oxide material; and
   forming a gate stack over the first layer of semiconductor material, the portion of the layer of oxide material and the first fin.

* * * * *